United States Patent
Xie (10) Patent No.: US 9,343,488 B2
(45) Date of Patent: May 17, 2016

(54) TFT ARRAY SUBSTRATE MANUFACTURING METHOD THEREOF AND DISPLAY DEVICE

(71) Applicant: BEIJING BOE OPTOELECTRONICS TECHNOLOGY CO., LTD., Beijing (CN)

(72) Inventor: Zhenyu Xie, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/133,768

(22) Filed: Dec. 19, 2013

(65) Prior Publication Data

US 2014/0175443 A1 Jun. 26, 2014

(30) Foreign Application Priority Data

Dec. 21, 2012 (CN) .......................... 2012 1 0564613

(51) Int. Cl.
*H01L 21/336* (2006.01)
*H01L 21/28* (2006.01)
*H01L 27/12* (2006.01)

(52) U.S. Cl.
CPC .................... *H01L 27/1288* (2013.01)

(58) Field of Classification Search
CPC ....... H01L 33/00; H01L 21/336; H01L 21/28; G02F 1/1345
USPC ........ 257/59, E21.411, E33.053; 438/151, 34
See application file for complete search history.

(56) References Cited

U.S. PATENT DOCUMENTS

2003/0057856 A1* 3/2003 Yamauchi et al. .......... 315/169.3
2004/0121244 A1* 6/2004 Misaka .............................. 430/5

(Continued)

FOREIGN PATENT DOCUMENTS

| CN | 101188243 A | 5/2008 |
|---|---|---|
| CN | 101957529 A | 1/2011 |
| CN | 202948926 U | 5/2013 |

OTHER PUBLICATIONS

The State Intellectual Property Office of the People's Republic of China ("SIPO") (Chinese Language) Office Action issued on May 19, 2014 by SIPO in Chinese Patent Application No. 201210564613.9; eight (8) pages.
English Translation of SIPO Office Action of Chinese Patent Application No. 201210564613.9 issued on May 19, 2014; six (6) pages.
English machine translation of Chinese Patent Document No. CN 101188243 A (above), from machine translation feature of LexisNexis TotalPatent.

(Continued)

*Primary Examiner* — Kimberly Rizkallah
*Assistant Examiner* — Brian Turner
(74) *Attorney, Agent, or Firm* — Ladas & Parry LLP (57) ABSTRACT

According to embodiments of the invention, there are provided a TFT array substrate, a manufacturing method thereof and a liquid crystal display. The manufacturing method comprises manufacturing a pattern including a gate electrode, a gate insulating layer pattern with a via hole, a pattern including an active layer, a pattern including source and drain electrodes and a pattern including a first electrode on a substrate. The formation of the gate insulating layer pattern with the via hole and the pattern including the active layer are completed through one patterning process, the pattern including the gate electrode at least includes the gate electrode and a gate leading wire, the via hole of the gate insulating layer is located over the gate leading wire, and the active layer is located over the gate electrode.

8 Claims, 6 Drawing Sheets

(56) References Cited

U.S. PATENT DOCUMENTS

| | | |
|---|---|---|
| 2004/0125327 A1* | 7/2004 | Choi et al. .................... 349/187 |
| 2009/0111251 A1* | 4/2009 | Miyata .......................... 438/514 |
| 2009/0314965 A1* | 12/2009 | Wu et al. ................. 250/492.22 |
| 2010/0197058 A1* | 8/2010 | Kim et al. ....................... 438/34 |
| 2011/0234936 A1 | 9/2011 | Yang et al. |
| 2014/0127891 A1* | 5/2014 | Chen et al. .................... 438/586 |

OTHER PUBLICATIONS

English machine translation of Chinese Patent Document No. CN 101957529A (above), from machine translation feature of LexisNexis TotalPatent.

English machine translation of Chinese Patent Document No. CN 202948926 U (above), from machine translation feature of LexisNexis TotalPatent.

\* cited by examiner

TFT ARRAY SUBSTRATE MANUFACTURING METHOD THEREOF AND DISPLAY DEVICE

CROSS REFERENCE TO RELATED APPLICATIONS

This application claims priority from Chinese National Application No. 201210564613.9 filed on Dec. 21, 2012, the contents of which are incorporated herein by reference.

FIELD OF THE INVENTION

Embodiments of the present invention relate to a Thin Film Transistor (TFT) array substrate, a manufacturing method thereof and a display device.

BACKGROUND

Currently, in order to realize application of technologies of high resolution, high aperture ratio and GOA (Gate Driver on Array), AD-SDS (Advanced-Super Dimensional Switching, referred to briefly as ADS) array substrate has been converted from the initial six-mask process to a seven-mask process.

In the prior art, the following seven masks are used to fabricate array substrates: a gate metal layer mask, an active layer mask, a gate insulating layer mask, a first electrode layer mask, a source/drain metal layer mask, a passivation layer mask and a second metal layer mask.

The seven-mask process is applied to the manufacture of array substrates, and the times of using the mask process are relatively more, leading to decline in productivity of products and a higher fabricating cost.

SUMMARY

According to an embodiment of the invention, there is provided a manufacturing method of a TFT array substrate, which comprises manufacturing a pattern including a gate electrode, a gate insulating layer pattern with a via hole, a pattern including an active layer, a pattern including source and drain electrodes and a pattern including a first electrode on a substrate, wherein, through one patterning process, the gate insulating layer pattern with the via hole and the pattern including the active layer are formed, wherein, the pattern including the gate electrode at least includes the gate electrode and a gate leading wire, the via hole of the gate insulating layer is located over the gate leading wire, and the active layer is located over the gate electrode.

In an example, the formation of the gate insulating layer pattern with the via hole and the pattern including the active layer through one patterning process includes:
forming an insulating layer thin film and a semiconductor thin film, and coating photoresist;
conducting an exposure and development treatment on the photoresist with a half-tone or grey-tone mask, so as to form a photoresist completely-removed portion situated in a preset via hole region, a photoresist completely-retained portion located over the gate electrode, and a photoresist half-retained portion located in other region;
removing a part of the insulating layer thin film and a part of the semiconductor thin film in the region of the photoresist completely-removed portion by using an etch process, so as to form the via hole;
removing the photoresist in the photoresist half-retained portion by using an ashing process;
removing the photoresist in the photoresist completely-retained portion by using a stripping process.

In an example, the formation of the gate insulating layer pattern with the via hole and the pattern including the active layer through one patterning process includes:
forming an insulating layer thin film and a semiconductor thin film, and coating photoresist;
conducting an exposure and development treatment on the photoresist with a half-tone or grey-tone mask, so as to form a photoresist completely-removed portion situated in a preset via hole region, a first photoresist completely-retained portion located over the gate electrode, a second photoresist completely-retained portion situated on the periphery of the preset via hole region, and a photoresist half-retained portion located in other region, wherein, each of the first photoresist completely-retained portion and the second photoresist completely-retained portion is a photoresist completely-retained portion;
at least removing a part of the insulating layer thin film and a part of the semiconductor thin film in the region of the photoresist completely-removed portion by using an etch process, so as to form the via hole;
at least removing the photoresist in the photoresist half-retained portion by using an ashing process;
at least removing a part of the semiconductor thin film in the region of the photoresist half-retained portion by using an etch process, so as to form the pattern including the active layer;
removing the remaining photoresist by using a stripping process.

In an example, width of the second photoresist completely-retained portion is in a range of 0.5~2 um;
at least removing of the photoresist half-retained portion by using an ashing process includes: removing the photoresist in the photoresist half-retained portion and the second photoresist completely-retained portion by using the ashing process;
at least removing of the part of the semiconductor thin film in the region of the photoresist half-retained portion by using the etch process includes: removing a part of the semiconductor thin film in the region of the photoresist half-retained portion and a part of the semiconductor thin film in the region of the second photoresist completely-retained portion by using the etch process;
removing the remaining photoresist by using a stripping process includes: removing the photoresist in the first photoresist completely-retained portion by using the stripping process.

In an example, width of the second photoresist completely-retained portion is in a range of 2~5 um;
at least removing of the photoresist half-retained portion by using an ashing process includes: removing the photoresist in the photoresist half-retained portion by using the ashing process;
at least removing of the part of the semiconductor thin film in the region of the photoresist half-retained portion by using the etch process includes: removing a part of the semiconductor thin film in the region of the photoresist half-retained portion by using the etch process;
removing the remaining photoresist by using the stripping process includes: removing the photoresist in the first photoresist completely-retained portion and the second photoresist completely-retained portion by using the stripping process.

In an example, the region in correspondence with the photoresist completely-removed portion is surrounded by the region in correspondence with the second photoresist completely-retained portion, and the region in correspondence with the second photoresist completely-retained portion is surrounded by the region in correspondence with the photoresist half-retained portion.

In an example, in the half-tone or grey-tone mask, the region in correspondence with the photoresist completely-removed portion is a transmissive layer, the region in correspondence with the photoresist half-retained portion is a half-transmissive layer, and the region in correspondence with the photoresist completely-retained portion is an opaque layer. Material for the opaque layer is chromium. Thickness of the photoresist in the photoresist half-retained portion is in a range of 2000~10000 Å.

According to another embodiment of the invention, there is provided a TFT array substrate that comprises a pattern including a gate electrode, a pattern including source and drain electrodes and a pattern including a first electrode that are disposed on a substrate, further comprising: a gate insulating layer pattern with a via hole and a pattern including an active layer that are formed through one patterning process, wherein, the pattern including the gate electrode at least includes the gate electrode and a gate leading wire, the via hole of the gate insulating layer is located over the gate leading wire, the pattern including the active layer is located over the gate electrode and a region around the via hole of the gate insulating layer.

In an example, the TFT array substrate further includes: a passivation layer pattern and a pattern including a second electrode.

The pattern including the first electrode and the pattern including the second electrode are disposed in the same layer, the pattern including the first electrode contains a plurality of first strip-like electrodes, the pattern including the second electrode contains a plurality of second strip-like electrodes, and the first strip-like electrodes and the second strip-like electrodes are disposed alternately. Alternatively, the pattern including the first electrode and the pattern including the second electrode are disposed in different layers, wherein, an electrode pattern in the upper layer contains a plurality of strip-like electrodes, and an electrode pattern in the lower layer contains a plurality of strip-like electrodes or takes the shape of a flat plate.

In an example, the pattern including the source and drain electrodes at least includes source and drain electrodes and a connecting metal layer covering the via hole of the gate insulating layer, the connecting metal layer is connected to the gate leading wire through the via hole.

In an example, the passivation layer pattern includes a passivation layer via hole, which is located over the connecting metal layer.

In an example, the pattern including the second electrode includes the second electrode and a connecting electrode covering the passivation layer via hole, and the connecting electrode is adapted for connection of an externally input signal and the connecting metal layer.

In an example, the via hole of the gate insulating layer is surrounded by a material ring made of the same material as the active layer.

According to still another embodiment of the invention, there is provided a display device, comprising the above array substrate.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) into the scope sought for protection by the invention.

Embodiment 1

According to an embodiment of the invention, there is provided a manufacturing method of a TFT array substrate, which comprises the manufacture of a pattern including a gate electrode, a gate insulating layer pattern with a via hole, a pattern including an active layer, a pattern including source and drain electrodes and a pattern including a first electrode on a substrate. The gate insulating layer pattern with the via hole and the pattern including the active layer are formed through one patterning process. The pattern including the gate electrode at least includes the gate electrode and a gate leading wire, the via hole of the gate insulating layer is located over the gate leading wire, and the active layer is located over the gate electrode.

It is to be noted here that, the one patterning process in embodiments of the invention is in correspondence with one mask process, use of one mask to fabricate some pattern is referred to as performance of one patterning process. The method provided by embodiments of the invention may be applied to fabrication of any of array substrates that include a gate insulating layer pattern with a via hole and include a pattern including an active layer.

In embodiments of the invention, the gate insulating layer pattern with the via hole and the pattern including the active layer are fabricated through one patterning process. As compared to the case where a gate insulating layer pattern with a via hole and a pattern including an active layer are fabricated separately through two patterning processes in prior art, the times of conducting the patterning process (i.e. mask process) are decreased, and the complexity of process and the manufacturing cost are reduced.

In an embodiment of the invention, the manufacturing method of the array substrate may include the following steps.

Figure 1:
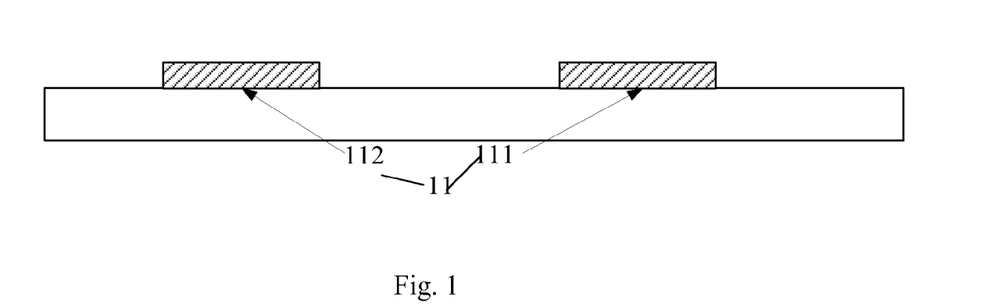
FIG. 1 to FIG. 8 are schematic views illustrating the structure of a substrate in a fabricating process provided by Embodiment 1 of the invention.

S1, a metal thin film is produced on a substrate, and a pattern 11 including a gate electrode as illustrated in FIG. 1 is formed through one patterning process, the pattern 11 including a gate electrode 111 and a gate leading wire 112.

Figure 2:
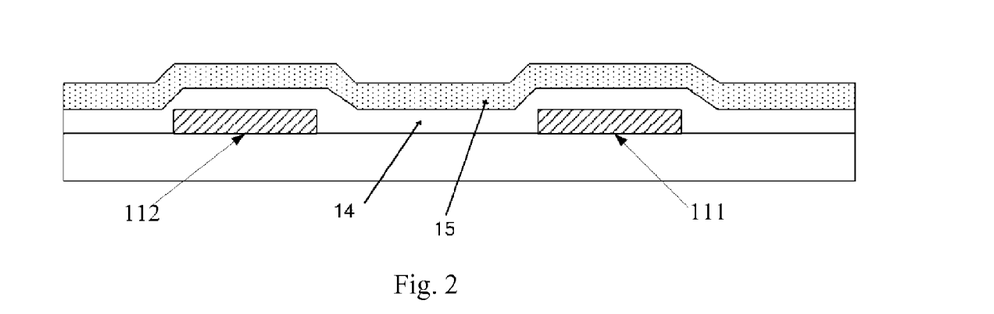

S2, as illustrated in FIG. 2, an insulating layer thin film and a semiconductor thin film are formed sequentially on the substrate subjected to the step S1.

Figure 3:
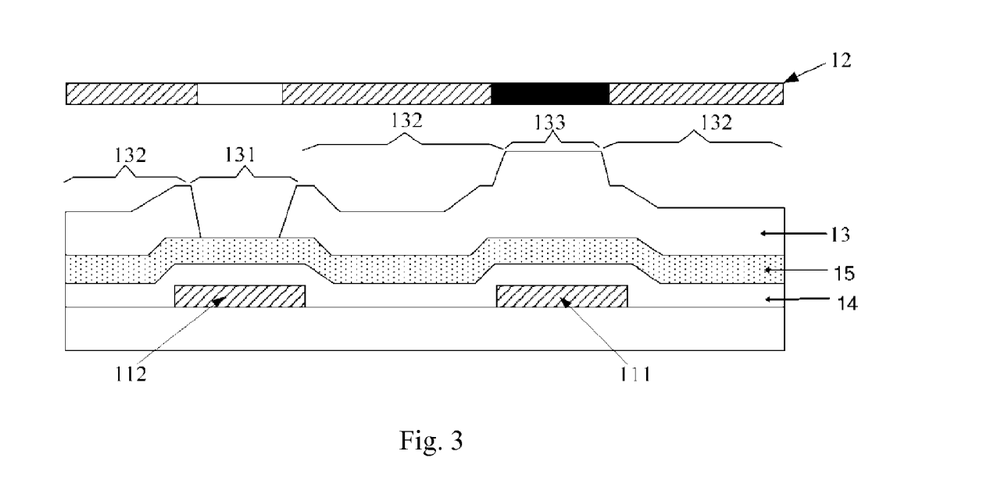

S3, photoresist is coated on the substrate illustrated in FIG. 2, and is subjected to an exposure and development treatment with a half-tone or grey-tone mask 12 illustrated in FIG. 3, so as to form a photoresist completely-removed portion 131 situated in a preset via hole region, a photoresist completely-retained portion 133 located over the gate electrode, and a photoresist half-retained portion 132 located in other region. Optionally, thickness of the photoresist in the photoresist half-retained portion is in the range of 2000~10000 Å.

There are many types of the photoresist, which can be classified into two types of negative photoresist and positive photoresist according to their chemical reaction mechanisms and developing principles. As for negative photoresist, insoluble matter is formed after illumination; and conversely, what is not soluble in some solvents and converted into soluble matter after illumination is positive photoresist. Photoresist of different types correspond to different masks. For example, if the photoresist is positive photoresist, then in the half-tone or grey-tone mask 12, the region in correspondence with the photoresist completely-removed portion 131 is a fully exposed zone, and material as used is a transmissive material; the region in correspondence with the photoresist half-retained portion 132 is a semi-exposed zone, and material as used is a half-transmissive material; and the region in correspondence with the photoresist completely-retained portion 133 is a non-exposed zone, and material as used is an opaque material. On the contrary, if the photoresist is negative photoresist, then in the half-tone or grey-tone mask 12, the region in correspondence with the photoresist completely-removed portion 131 is a non-exposed zone, and material as used is an opaque material; the region in correspondence with the photoresist completely-retained portion 133 is a fully exposed zone, and material as used is a transmissive material; and the region in correspondence with the photoresist half-retained portion 132 is a semi-exposed zone, and material as used is a half-transmissive material.

Figure 4:
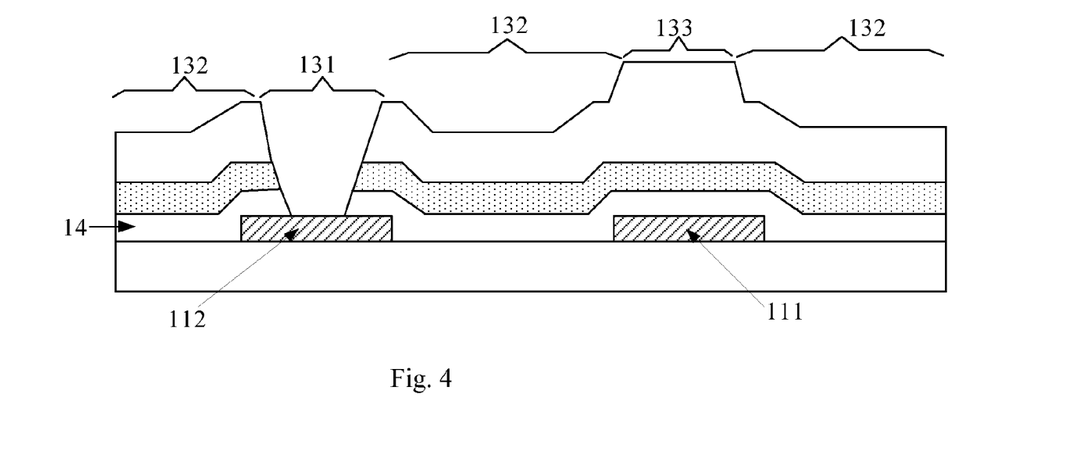

S4, a part of the insulating layer thin film and a part of the semiconductor thin film in the region of the photoresist completely-removed portion 131 are removed by using an etch process, to form a via hole 140 of the gate insulating layer located over the gate leading wire 112, thereby fabricating the substrate formed with a gate insulating layer pattern 14 as illustrated in FIG. 4. The via hole of the gate insulating layer is useful for input of a gate driving signal into the gate leading wire.

Figure 5:
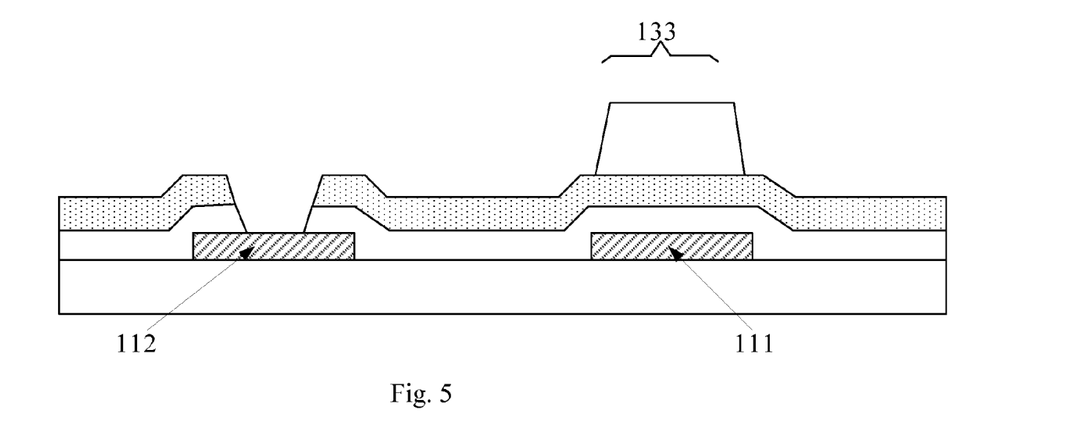

S5, the photoresist half-retained portion 132 is removed by using an ashing process, so as to form the substrate illustrated in FIG. 5. The photoresist completely-retained portion 133 has a larger thickness of photoresist than the photoresist half-retained portion 132, and so, after the photoresist half-retained portion 132 is removed, the photoresist completely-retained portion 133 is still left as regards the photoresist on the substrate.

Figure 6:
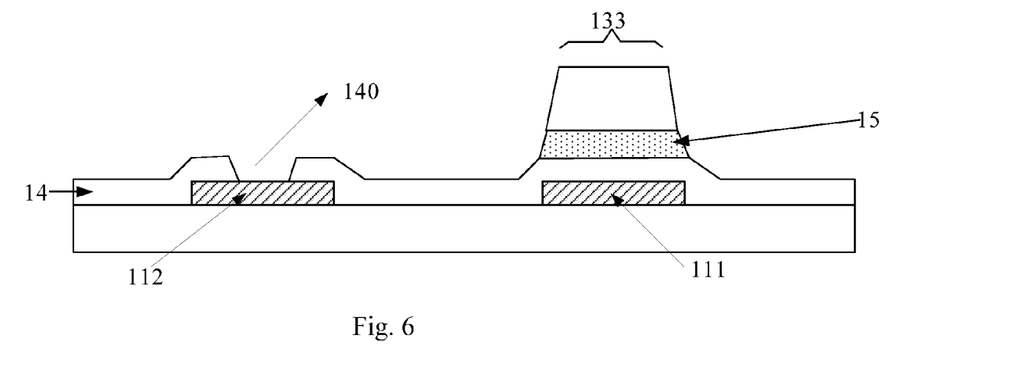

S6, a part of semiconductor thin film in in the region of the photoresist half-retained portion is removed by using an etch process, so that the substrate formed to include an active layer pattern 15 illustrated in FIG. 6 is fabricated.

Figure 7:
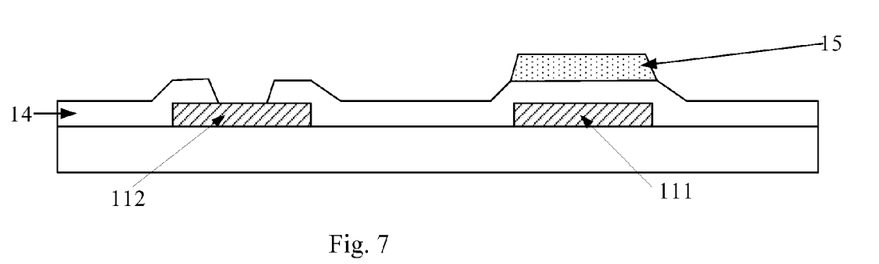

S7, the photoresist remaining in the photoresist completely-retained portion 133 illustrated in FIG. 6 is removed by using a stripping process, so as to form the substrate illustrated in FIG. 7.

In the steps S3 to S7, the gate insulating layer pattern 14 with the via hole and the pattern 15 including the active layer are formed merely by conducting one patterning process with one mask. As compared to the case where a gate insulating layer pattern with a via hole and a pattern including an active layer are fabricated separately through two patterning processes in prior art, the times of conducting the patterning process (i.e. mask process) are decreased, and the complexity of process and the manufacturing cost are reduced.

Figure 8:
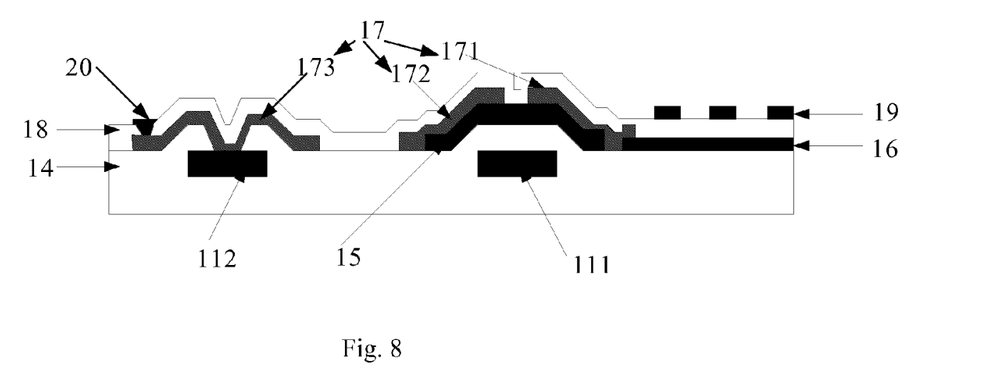

S8, as illustrated in FIG. 8, in accordance with the patterning process in prior art, a pattern including a first electrode 16, a pattern 17 including source and drain electrodes, a passivation layer pattern 18 and a pattern including a second electrode 19 are formed sequentially on the substrate subjected to the step S7. Certainly, it is also possible that the pattern 17 including source and drain electrodes is produced earlier, and the pattern including the first electrode 156 is produced later, and no limit will be set on the order of priority of them here. The pattern 17 including source and drain electrodes at least includes a drain electrode 171, a source electrode 172, and a connecting metal layer 173 that is connected to the gate leading wire 112 through a via hole on the gate insulating layer pattern 14. The drain electrode 171 is connected to the first electrode 16.

For example, the passivation layer pattern 18 includes a passivation layer via hole, which is located over the connecting metal layer 173 and useful for input of an external gate driving signal into the connecting metal layer and the gate leading wire covered by the connecting metal layer. Certainly, in a GOA circuit, as a gate drive is integrated into a substrate, the passivation layer via hole may not be provided, either.

For example, if the passivation layer pattern includes a passivation layer via hole disposed over the connecting metal layer 173, a connecting electrode 20 is further included in the pattern including the second electrode 19 that is formed by manufacture. As illustrated in FIG. 8, the connecting electrode 20 covers the passivation layer via hole, and acts to input an external drive signal into the gate leading wire for driving. Of course, for a GOA circuit, the passivation layer via hole may not be provided, either; and accordingly, it is also unnecessary to provide the connecting electrode.

Embodiment 2

As the area of a substrate is larger, (with a TFT-LCD 5-generation line as an example, the area of a substrate is 1.1 m×1.3 m), there is a certain amount of fluctuation in transmittance of a semi-exposed zone in a half-tone or grey-tone mask, and the transmittance is generally in the range of 405~50%. Thus, after exposure and development, in the semi-exposed zone, thickness of photoresist corresponding to an area with a higher transmittance is smaller, and thickness of photoresist corresponding to an area with a lower transmittance is larger. Thickness of photoresist in a photoresist half-retained portion is not uniform, and will range between 2000 Å and 8000 Å.

In the Embodiment 1, if the photoresist is a positive photoresist, then as for the periphery of a fully-exposed zone corresponding to the photoresist completely-removed portion 131, its exposure intensity when exposed is superimposing of those of the fully-exposed zone and the semi-exposed zone at its edge. Because there is a relatively large difference of exposure intensity between different areas in the semi-exposed zone, for the periphery of the fully-exposed zone, its exposure intensity also varies along with it. The result is that, regarding via holes in the fully-exposed zone, some are big, some are small, and the size has a relatively poor uniformity and ranges between 0 and 4 micrometers.

According to an embodiment of the invention, there is provided a manufacturing method of an array substrate, allowing via hole size in a fully-exposed zone to be uniform. The manufacturing method as stated in Embodiment 1 can be referred by its manufacturing method, the only consideration is to perform the above steps S3 to S7 in accordance with the following steps Q3 to Q7, and regarding other steps, corresponding steps in Embodiment 1 can be referred.

Q3, photoresist is coated on the substrate illustrated in FIG. 2, and subjected to an exposure and development treatment with a half-tone or grey-tone mask, so as to form a photoresist completely-removed portion 131 situated in a preset via hole region, a first photoresist completely-retained portion 1331 located over the gate electrode, a second photoresist completely-retained portion 1332 situated on the periphery of the preset via hole region, and a photoresist half-retained portion 132 located in other region.

For example, area corresponding to the photoresist completely-removed portion 131 is surrounded by area corresponding to the second photoresist completely-retained portion 1332, and area corresponding to the second photoresist completely-retained portion 1332 is surrounded by area corresponding to the photoresist half-retained portion 132.

Optionally, in the half-tone or grey-tone mask, a fully-exposed zone corresponding to the photoresist completely-removed portion 131 is of a transmissive material, the semi-exposed zone corresponding to the photoresist half-retained portion 132 is of a semi-transmissive material, and a non-exposed zone corresponding to the first photoresist completely-retained portion 1331 and the second photoresist completely-retained portion 1332 is of an opaque material. Reference to the mask illustrated in FIG. 2 can be made, and illustration will not be given here.

Figure 9:
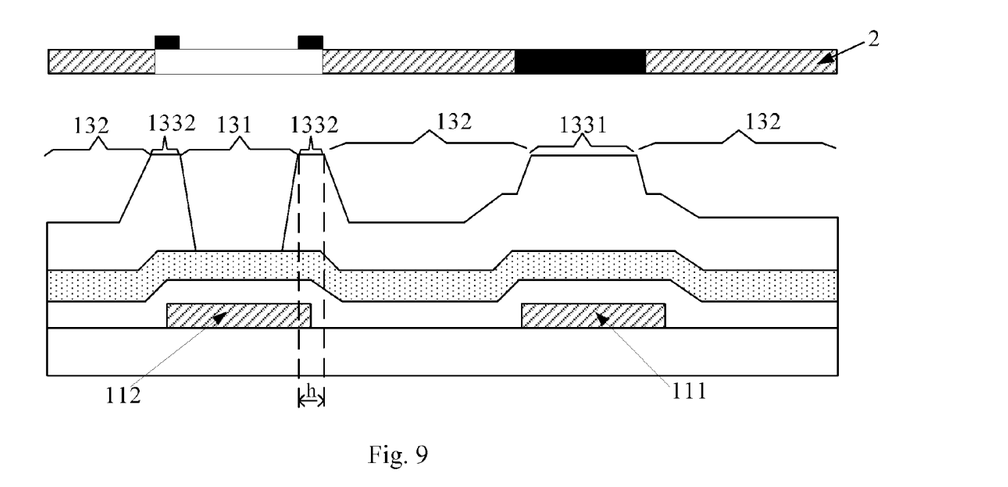
FIG. 9 to FIG. 16 are schematic views illustrating the structure of a substrate in another fabricating process provided by Embodiment 2 of the invention.

Alternatively, in a selectable mode, as illustrated in FIG. 9, the half-tone or grey-tone mask may also be the mask in Embodiment 1, and the only difference is that an opaque layer is disposed over a mask area corresponding to the second photoresist completely-retained portion 1332. For example, material for the opaque layer is chromium.

Figure 10:
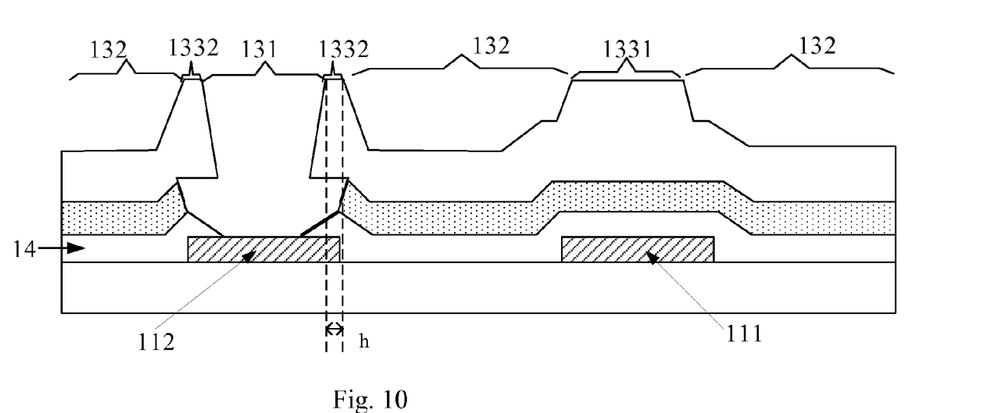
Figure 11:
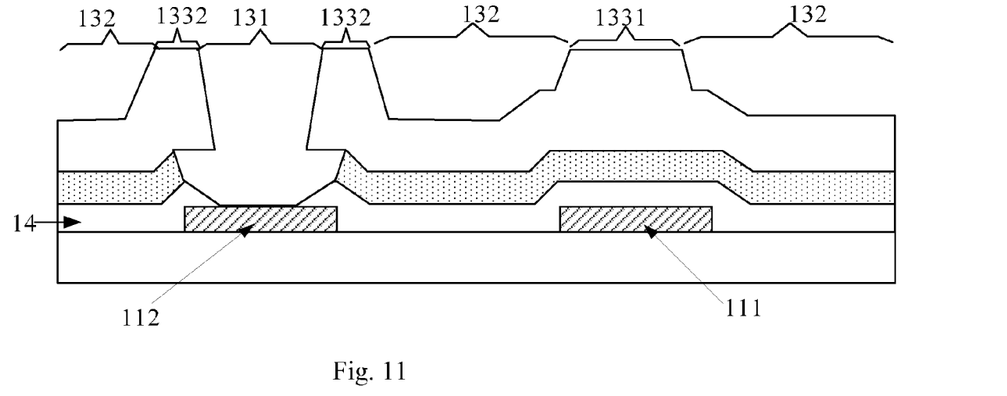

For example, width h of the second photoresist completely-retained portion 1332 is in the range of 2~5 um;

Q4, a part of the insulating layer thin film and a part of the semiconductor thin film in the region of the photoresist completely-removed portion are removed by using an etch process, to form the via hole of the gate insulating layer, thereby fabricating the substrate formed with a gate insulating layer pattern 14 illustrated in FIG. 10 or FIG. 11. The width h of the second photoresist completely-retained portion 1332 illustrated in FIG. 10 is relatively small (it ranges between 0.5 μm and 2 μm), and is only formed over the via hole; as illustrated in FIG. 11, the width h of the second photoresist completely-retained portion 1332 is relatively large (it ranges between 2 μm and 5 μm), and is formed over the via hole and an active layer region surrounding it.

Q5, the photoresist in the photoresist half-retained portion is at least removed by using an ashing process.

As illustrated in FIG. 10, the width h of the second photoresist completely-retained portion 1332 is relatively small. When an example width of the second photoresist fully-retained portion is in the range of 0.5~2 μm, the at least removing of the photoresist half-retained portion by using an ashing process includes: removing the photoresist half-retained portion 132 and the second photoresist completely-retained portion 1332 by using the ashing process. At this time, as illustrated in FIG. 10, width of the photoresist completely-retained portion is smaller, and when the photoresist in the photoresist half-retained portion 132 is removed, the second photoresist completely-retained portion 1332 will also be removed, forming the substrate illustrated in FIG. 12.

Figure 17:
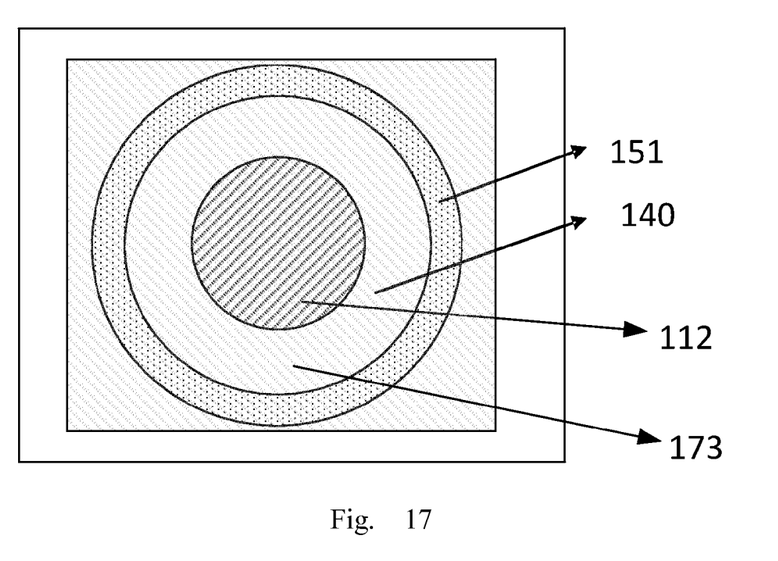
FIG. 17 is a schematic plan view illustrating the configuration of a via hole portion formed in an example of the Embodiment 2 of the invention.

Alternatively, as illustrated in FIG. 11, the width h of the second photoresist completely-retained portion 1332 is relatively large. When an example width of the second photoresist fully-retained portion is in the range of 2~5 μm, the at least removing of the photoresist half-retained portion by using an ashing process includes: removing the photoresist in the photoresist half-retained portion 132 by using the ashing process. At this time, as illustrated in FIG. 11, width of the photoresist completely-retained portion is larger, and when the photoresist half-retained portion 132 is removed, the second photoresist completely-retained portion 1332 will not be removed, forming the substrate illustrated in FIG. 13. In this case, the via hole 140 on the formed substrate is surrounded by a material ring 151 formed of the same material as the active layer, as illustrated in FIG. 17. FIG. 17 is a plan view merely illustrating the configuration of the part corresponding to the via hole. Furthermore, only via hole 140 and the material ring 151 are illustrated to illustrate positional relationship between the two clearly, while other structures are omitted.

Q6, a part of semiconductor thin film in the region of the photoresist half-retained portion is at least removed by using an etch process, so as to form the pattering 15 including the active layer. The active layer is located over the gate electrode.

Figure 12:
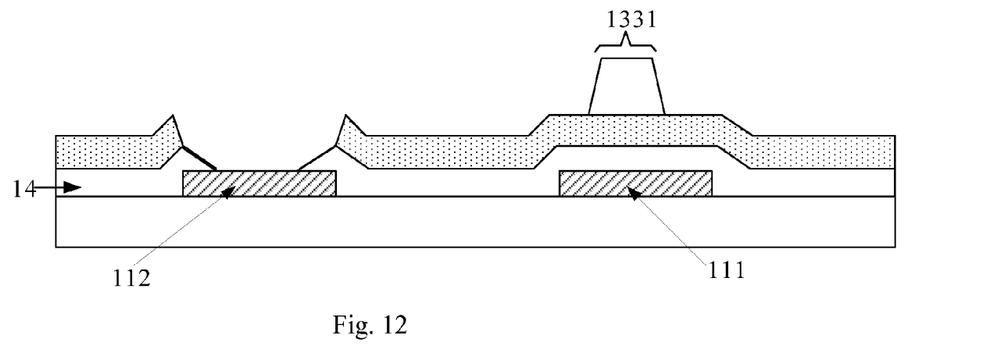

If width h of the second photoresist completely-retained portion 1332 is relatively small, then while a part of semiconductor thin film in the region of the photoresist half-retained portion is removed by using an etch process on the substrate illustrated in FIG. 12, a part of semiconductor thin film in the region of the second photoresist completely-retained portion is removed as well, so that the substrate formed to include the active layer pattern 15 illustrated in FIG. 6 can be fabricated.

Figure 13:
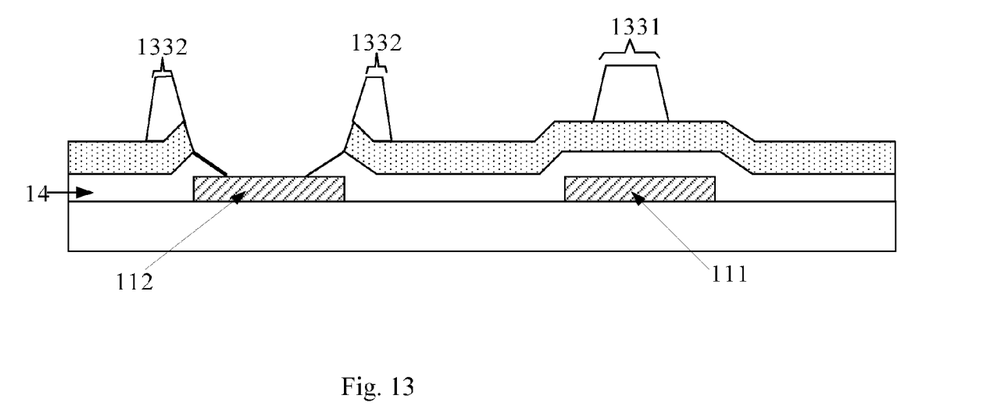
Figure 14:
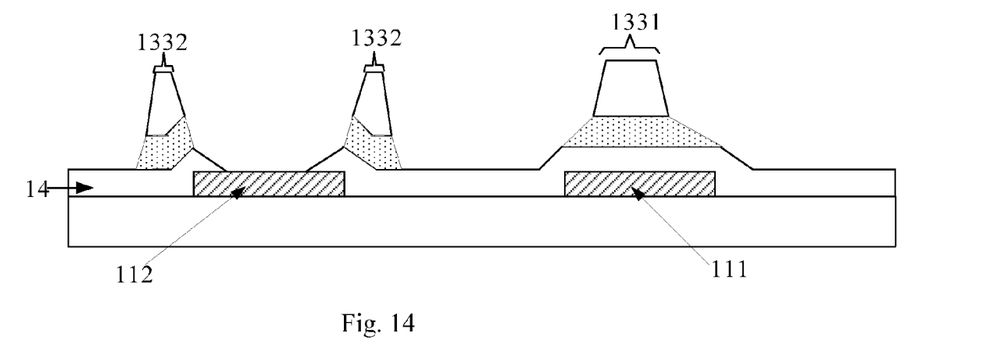

If width h of the second photoresist completely-retained portion 1332 is relatively large, then by using an etch process on the substrate illustrated in FIG. 13, a part of semiconductor thin film in the region of the photoresist half-retained portion is only removed, so that the substrate formed to include the active layer pattern 15 illustrated in FIG. 14 can be fabricated.

Q7, the remaining photoresist is removed by using a stripping process.

For selection, a stripping process is applied to the substrate illustrated in FIG. 6 to remove the remaining photoresist, so that the substrate illustrated in FIG. 7 can be fabricated. A stripping process is applied to the substrate illustrated in FIG. 14 to remove the remaining photoresist, i.e., the photoresist in the first photoresist completely-retained portion 1331 and the second photoresist completely-retained portion 1332, so that the substrate illustrated in FIG. 15 can be fabricated.

Figure 15:
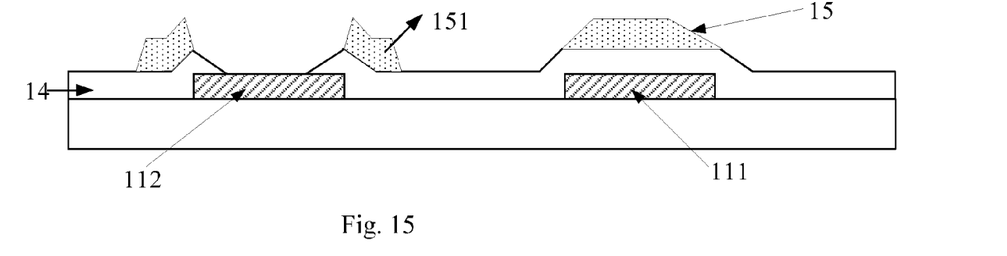
Figure 16:
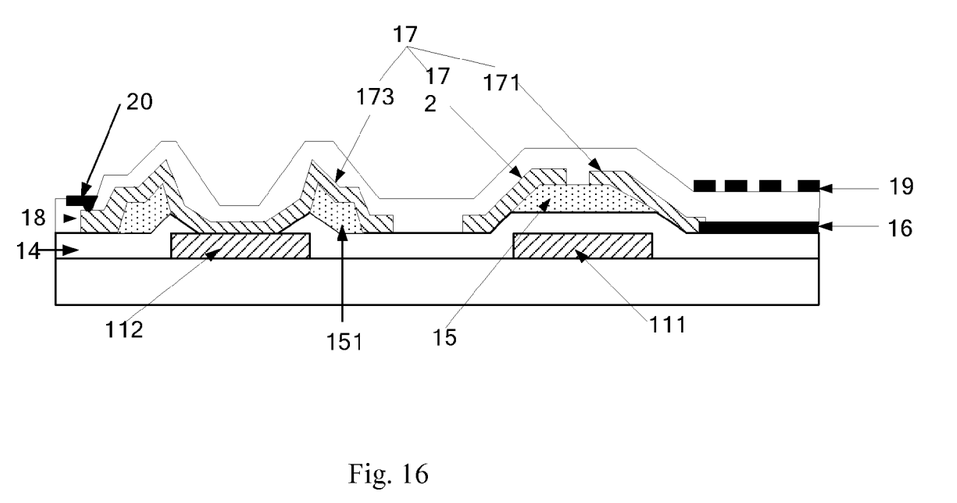

Optionally, after the substrate illustrated in FIG. 15 is completed, a step S8 is performed, so that the array substrate illustrated in FIG. 16 can be fabricated.

According to an embodiment of the invention, there is provided a TFT array substrate, which comprises a pattern including a gate electrode, a pattern including source and drain electrodes, a pattern including a first electrode, and an gate insulating layer pattern with a via hole and a pattern including an active layer formed through one patterning process, which are disposed on a substrate. The pattern including the gate electrode at least includes the gate electrode and a gate leading wire, the via hole of the gate insulating layer is located over the gate leading wire, the pattern including the active layer is located over the gate electrode and an area surrounding the via hole hole of the gate insulating layer.

For selection, as illustrated in FIG. 16, the array substrate comprises a pattern including a gate electrode, a pattern 17 including source and drain electrodes, a pattern including a first electrode 16, and an gate insulating layer pattern 14 with a via hole and a pattern 15 including an active layer formed through one patterning process, which are disposed on a substrate. The pattern including the gate electrode at least includes the gate electrode 111 and a gate leading wire 112, the via hole of the gate insulating layer is located over the gate leading wire, the pattern including the active layer is located over the gate electrode 111 and an area surrounding the via hole hole of the gate insulating layer. The pattern including source and drain electrodes includes a source electrode 172, a drain electrode 171 and a connecting metal layer 173 that covers the via hole of the gate insulating layer, the drain electrode is connected to the first electrode 16, and the connecting metal layer 173 is connected to the gate leading wire 112.

For example, the array substrate further includes a passivation layer pattern 18 and a pattern including a second electrode 19.

For example, the passivation layer pattern 18 includes a passivation layer via hole, which is located over the connecting metal layer 173, and acts to connect the connecting metal layer 173 and an external drive signal.

For example, the pattern including the second electrode 19 includes a second electrode 19 and a connecting electrode 20 that covers the passivation layer via hole, which acts to connect an external drive signal and the connecting metal layer 173, so as to further input the external drive signal into the gate leading wire 112. Of course, for a GOA circuit, as a gate drive is integrated into a substrate, the passivation layer via hole may not be provided; an accordingly, the connecting electrode is not required, either.

The TFT array substrate provided by embodiments of the invention can be applied to production of liquid crystal display devices of an AD-SDS (Advanced-Super Dimensional Switching, briefly called as ADS) mode, an IPS (In Plane Switch) mode, a TN (Twist Nematic) mode, and other modes. In the AD-SDS technology, a multi-dimensional electric field is formed by parallel electric fields produced at edges of pixel electrodes on the same plane and a longitudinal electric field produced between pixel electrodes and a common electrode layer, so as to allow liquid crystal molecules with all alignment directions within a liquid crystal cell, which are located directly above the electrode and between the pixel electrodes, to be rotated and switched, and thereby the work efficiency of planar-oriented system liquid crystals is enhanced and the transmissive efficiency is increased.

Whichever liquid crystal display device as stated above includes a color filter substrate and an array substrate that are formed by cell-assembling. The difference lies in that, for a TN mode display device, a common electrode is disposed on the color filter substrate, a pixel electrode is disposed on the array substrate, and only a first electrode is included in the array substrate; for an ADS mode display device and an IPS mode display device, a common electrode and a pixel electrode both are disposed on the array substrate, and the array substrate further includes a pattern including a second electrode.

In an array substrate of the ADS mode display device, the first electrode and the second electrode may be disposed in different layers, wherein, an electrode in the upper layer contains a plurality of strip-like electrodes, and an electrode in the lower layer contains a plurality of strip-like electrodes or takes the form of a flat plate. For selection, as illustrated in FIG. 16, the second electrode 19 that are located in the upper layer and contains a plurality of strip-like electrodes is a common electrode, and the plate-like first electrode 16 is a pixel electrode.

Disposing in different layers is described in terms of at least two patterns, and disposing in different layers of the at least two patterns means that, at least two layers of thin film are formed to the at least two patterns through patterning processes, respectively. Disposing in different layers of two patterns means that, through patterning processes, a pattern is formed by each of two layers of thin film. For example, disposing in different layers of a first electrode and a second electrode means that, the first electrode is formed by a first layer of transparent conductive thin film through patterning process, and the second electrode is formed by a second layer of transparent conductive thin film through patterning process. For example, the first electrode is a pixel electrode (or a common electrode), and the second electrode is a common electrode (or a pixel electrode).

In an array substrate of the IPS mode display device, the first electrode and the second electrode are disposed in the same layer, the first electrode contains a plurality of first strip-like electrodes, the second electrode contains a plurality of second strip-like electrodes, and the first strip-like electrodes and the second strip-like electrodes are disposed alternately.

Disposing in the same layer is described in terms of at least two patterns; and disposing in the same layer of the at least two patterns means that, the same thin film is formed to the at least two patterns through patterning process. For example, disposing in the same layer of a first electrode and a second electrode means that, the first electrode and the second electrode are formed by the same transparent conductive thin film through patterning process. Such an electrode that is electrically connected to a data line via hole a switch unit (e.g. it may be a thin film transistor) is a pixel electrode, and such an electrode that is electrically connected to a common electrode line is a common electrode.

According to still another embodiment of the invention, there is further provided a display device, comprising any of the above-mentioned TFT array substrates. The display device may be a liquid crystal display, a liquid crystal television, a digital camera, a cell phone, a tablet computer or other product or component having a display function.

Descriptions made above are merely exemplary embodiments of the invention, but are not used to limit the protection scope of the invention. The protection scope of the invention is determined by attached claims.

What is claimed is:

1. A manufacturing method of a TFT array substrate, which comprises manufacturing a pattern including a gate electrode, a gate insulating layer pattern with a via hole, a pattern including an active layer, a pattern including source and drain electrodes and a pattern including a first electrode on a substrate, wherein, through one patterning process, the gate insulating layer pattern with the via hole and the pattern including the active layer are formed, the pattern including the gate electrode at least includes the gate electrode and a gate leading wire, the via hole of the gate insulating layer is located over the gate leading wire, and the active layer is located over the gate electrode, the formation of the gate insulating layer pattern with the via hole and the pattern including the active layer through one patterning process includes:

forming an insulating layer thin film and a semiconductor thin film, and coating photoresist;

conducting an exposure and development treatment on the photoresist with a half-tone or grey-tone mask, so as to form a photoresist completely-removed portion situated in a preset via hole region, a first photoresist completely-retained portion located over the gate electrode, a second photoresist completely-retained portion situated on the periphery of the preset via hole region and surrounding the photoresist completely-removed portion situated in a preset via hole region, and a photoresist half-retained portion located in other region;

removing a part of the insulating layer thin film and a part of the semiconductor thin film in the region of the photoresist completely-removed portion by using an etch process, so as to form the via hole;

at least removing the photoresist in the photoresist half-retained portion by using an ashing process;

at least removing a part of the semiconductor thin film in the region of the photoresist half-retained portion by using an etch process, so as to form the pattern including the active layer;

removing the remaining photoresist by using a stripping process.

2. A The manufacturing method according to claim 1, wherein, width of the second photoresist completely-retained portion is in a range of 0.5~2 um;

at least removing of the photoresist half-retained portion by using an ashing process includes: removing the photoresist in the photoresist half-retained portion and the second photoresist completely-retained portion by using the ashing process;

at least removing of the part of the semiconductor thin film in the region of the photoresist half-retained portion by using the etch process includes: removing a part of the semiconductor thin film in the region of the photoresist half-retained portion and a part of the semiconductor thin film in the region of the second photoresist completely-retained portion by using the etch process;

removing of the remaining photoresist by using a stripping process includes: removing the photoresist in the first photoresist completely-retained portion by using the stripping process.

3. A The manufacturing method according to claim 2, wherein, the region in correspondence with the photoresist completely-removed portion is surrounded by the region in correspondence with the second photoresist completely-retained portion, and the region in correspondence with the second photoresist completely-retained portion is surrounded by the region in correspondence with the photoresist half-retained portion.

4. The manufacturing method according to claim 1, wherein, width of the second photoresist completely-retained portion is in a range of 2~5 um;

at least removing of the photoresist half-retained portion by using an ashing process includes: removing the photoresist in the photoresist half-retained portion by using the ashing process;

at least removing of the part of the semiconductor thin film in the region of the photoresist half-retained portion by using the etch process includes: removing a part of the semiconductor thin film in the region of the photoresist half-retained portion by using the etch process;

removing of the remaining photoresist by using the stripping process includes: removing the photoresist in the first photoresist completely-retained portion and the second photoresist completely-retained portion by using the stripping process.

5. A The manufacturing method according to claim 4, wherein, the region in correspondence with the photoresist completely-removed portion is surrounded by the region in correspondence with the second photoresist completely-retained portion, and the region in correspondence with the second photoresist completely-retained portion is surrounded by the region in correspondence with the photoresist half-retained portion.

6. The manufacturing method according to claim 1, wherein, in the half-tone or grey-tone mask, the region in correspondence with the photoresist completely-removed portion is a transmissive layer, the region in correspondence with the photoresist half-retained portion is a half-transmissive layer, and the region in correspondence with the first photoresist completely-retained portion and the second photoresist completely-retained portion is an opaque layer.

7. The manufacturing method according to claim 6, wherein, material for the opaque layer is chromium.

8. The manufacturing method according to claim 1, wherein, thickness of the photoresist in the photoresist half-retained portion is in a range of 2000~10000 Å.

\* \* \* \* \*